(12) United States Patent
Lacey et al.

(10) Patent No.: US 6,388,464 B1
(45) Date of Patent: May 14, 2002

(54) CONFIGURABLE MEMORY FOR PROGRAMMABLE LOGIC CIRCUITS

(75) Inventors: Timothy M. Lacey, Bedford, NH (US); David L. Johnson, Pleasanton, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/475,808

(22) Filed: Dec. 30, 1999

(51) Int. Cl.[7] ..................... H03K 19/177; H03K 19/173
(52) U.S. Cl. ........................................... 326/40; 326/47
(58) Field of Search ............................. 326/40, 41, 47, 326/37, 38

(56) References Cited

U.S. PATENT DOCUMENTS

| | | | |
|---|---|---|---|
| 4,878,200 A | 10/1989 | Asghar et al. | 365/189.02 |
| 5,136,188 A | 8/1992 | Ha et al. | |
| 5,144,582 A | 9/1992 | Steele | 365/189.08 |
| 5,280,202 A | 1/1994 | Chan et al. | |
| 5,384,745 A | 1/1995 | Konishi et al. | 365/230.03 |
| 5,422,823 A | 6/1995 | Agrawal et al. | 364/489 |
| 5,451,887 A | 9/1995 | El-Avat et al. | 326/39 |
| 5,455,525 A | 10/1995 | Ho et al. | 326/41 |
| 5,521,529 A | 5/1996 | Agrawal et al. | 326/41 |
| 5,537,057 A | 7/1996 | Leong et al. | 326/41 |
| 5,587,945 A | 12/1996 | Lin et al. | 365/185.1 |
| 5,646,901 A | 7/1997 | Sharpe-Geisler et al. | 365/218 |
| 5,781,030 A | 7/1998 | Agrawal et al. | 326/39 |
| 5,799,176 A | 8/1998 | Kapusta et al. | 395/556 |
| 5,811,987 A | 9/1998 | Ashmore et al. | 326/39 |
| 5,818,254 A | 10/1998 | Agrawal et al. | 326/39 |
| 5,848,285 A | 12/1998 | Kapusta et al. | 395/800.01 |
| 5,966,027 A | 10/1999 | Kapusta et al. | 326/39 |
| 5,977,791 A * | 11/1999 | Veenstra | 326/40 |
| 6,049,223 A * | 4/2000 | Lytle et al. | 326/40 |
| 6,058,452 A * | 5/2000 | Rangasayee et al. | 711/108 |
| 6,134,181 A | 10/2000 | Landry | 365/233 |
| 6,137,308 A | 10/2000 | Nayak | 326/39 |
| 6,191,998 B1 * | 2/2001 | Reddy et al. | 365/230.05 |
| 6,201,407 B1 | 3/2001 | Kapusta et al. | 326/39 |

OTHER PUBLICATIONS

"Hybrid Product Term and Lut Based Architectures Using Embedded Memory Blocks", By Frank Heile and Andrew Leaver, pp. 13–16.

"An Innovative, Segmented High Performance FPGA Family With Variable–Grain–Architecture and Wide–Gating Functions", By Om Agrawal et al., pp. 17–26.

"A New High Density And Very Low Cost Reprogrammable FPGA Architecture", By Sinan Kaptanoglu et al., pp. 3–12.

"XC4000E and XC4000X Series Field Programmable Gate Arrays", XILINX, May 14, 1996 (Version 1.6), pp. 6–5 to 6–72.

"XC4000XLA/XV Field Programmable Gate Arrays", XILINX, Oct. 18, 1999, pp. 6–157 to 6–170.

"Virtex ™ 2.5V Field Programmable Gate Arrays", XILINX, Apr. 2, 2001, pp. 1–20.

"Coolrunner ® XPLA3 CPLD", Xilinx, Apr. 11, 2001, pp. 1–10.

"Spartan And Spartan–XL Families Field Programmable Gate Arrays", Xilinx, Mar. 2, 2000, pp. 4–1 to 4–66.

"XC9500XV Family High–Perfromance CPLD",Xilinx, Jan. 15, 2001, pp. 1–18.

(List continued on next page.)

Primary Examiner—Michael Tokar
Assistant Examiner—James H. Cho
(74) Attorney, Agent, or Firm—Christopher P. Malorana, P.C.; Robert M. Miller

(57) ABSTRACT

An apparatus comprising a memory device and a programmable logic device. The memory device may be configured to (i) connect to a first bus and a second bus and (ii) operate in one or more modes in response to one or more control signals. The programmable logic device may be configured to generate the control signals.

18 Claims, 6 Drawing Sheets

OTHER PUBLICATIONS

"Integrated Product–Term Logic In Apex 20K Devices", Altera, Apr. 1999, ver. 1.0, pp. 1–12.

"Apex II Programmable Logic Device Family", Altera, May 2001, ver. 1.1, pp. 1–96.

"Flex 8000 Programmable Logic Device Family", Altera, Jun. 1999, ver. 10.01, pp. 349–410.

"Flex 10K Embedded Programmable Logic Device Family", Altera, Mar. 2001, ver. 4.1, pp. 1–128.

"Max 7000 Programmable Logic Device Family", Altera, Mar. 2001, ver. 6.1, pp. 1–62.

"Max 9000 Programmable Logic Device Family", Altera, Jul. 1999, ver. 6.01, pp. 1–40.

"Mach 5 CPLD Family—Fifth Generation Mach Architecture", Lattice Semiconductor Corp., Rev. 1, Sep. 2000, p. 1–47.

Timothy M. Lacey et al., "Programmable Logic Device", U.S. Serial No. 09/475,879, Filed Dec. 30, 1999.

\* cited by examiner-

CONFIGURABLE MEMORY FOR PROGRAMMABLE LOGIC CIRCUITS

CROSS-REFERENCE TO RELATED APPLICATIONS

The present invention may relate to application U.S. Ser. No. 09/475,879, filed concurrently, which is hereby incorporated by reference in its entirety.

FIELD OF THE INVENTION

The present invention relates to memory devices generally and, more particularly, to a configurable memory for programmable logic devices.

BACKGROUND OF THE INVENTION

Traditionally there are two types of programmable logic architectures: complex programmable logic device (CPLDs) and field programmable gate arrays (FPGAs). The CPLD can be constructed as a one-dimensional array of logic blocks made of 16 macrocells and a product term array connected through a single central interconnect scheme. The CPLD achieves high performance by being able to complete a complex logic function in a single pass of the logic array, and has predictable timing by having every output or I/O pin connected to every logic block input through a central interconnect structure. The CPLD can be non-volatile by using an EEPROM process. However, the CPLD has no available on-chip RAM.

An FPGA architecture is constructed from a two dimensional array of logic blocks called CLBs. The CLBs are made from 4-input look-up-tables (LUTs) and flip-flops. The LUTs can be used as distributed memory blocks. The CLBs are connected by a segmented interconnect structure. The FPGA architecture supports a low standby power and the LUTs can use a simple logic CMOS process. Since the two-dimensional array of CLBs and the segmented interconnect structure are scalable, an FPGA can achieve high density. However, a dual port or FIFO memory is slow and inefficient to implement with LUTs.

SUMMARY OF THE INVENTION

The present invention concerns an apparatus comprising a memory device and a programmable logic device. The memory device may be configured to (i) connect to a first bus and a second bus and (ii) operate in one or more modes in response to one or more control signals. The programmable logic device may be configured to generate the control signals.

The objects, features and advantages of the present invention include providing an architecture, circuit and/or method for a configurable memory that may (i) provide a configurable single port RAM, dual port RAM and/or FIFO, (ii) provide dedicated dual port memory logic and arbitration, and FIFO memory logic and flags that may improve memory performance, (iii) be placed in the routing channels of a programmable logic device to achieve higher performance with I/O blocks, (iv) be cascadable with other configurable memory blocks to form larger block sizes and/or (v) be used as synchronous or asynchronous memory.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
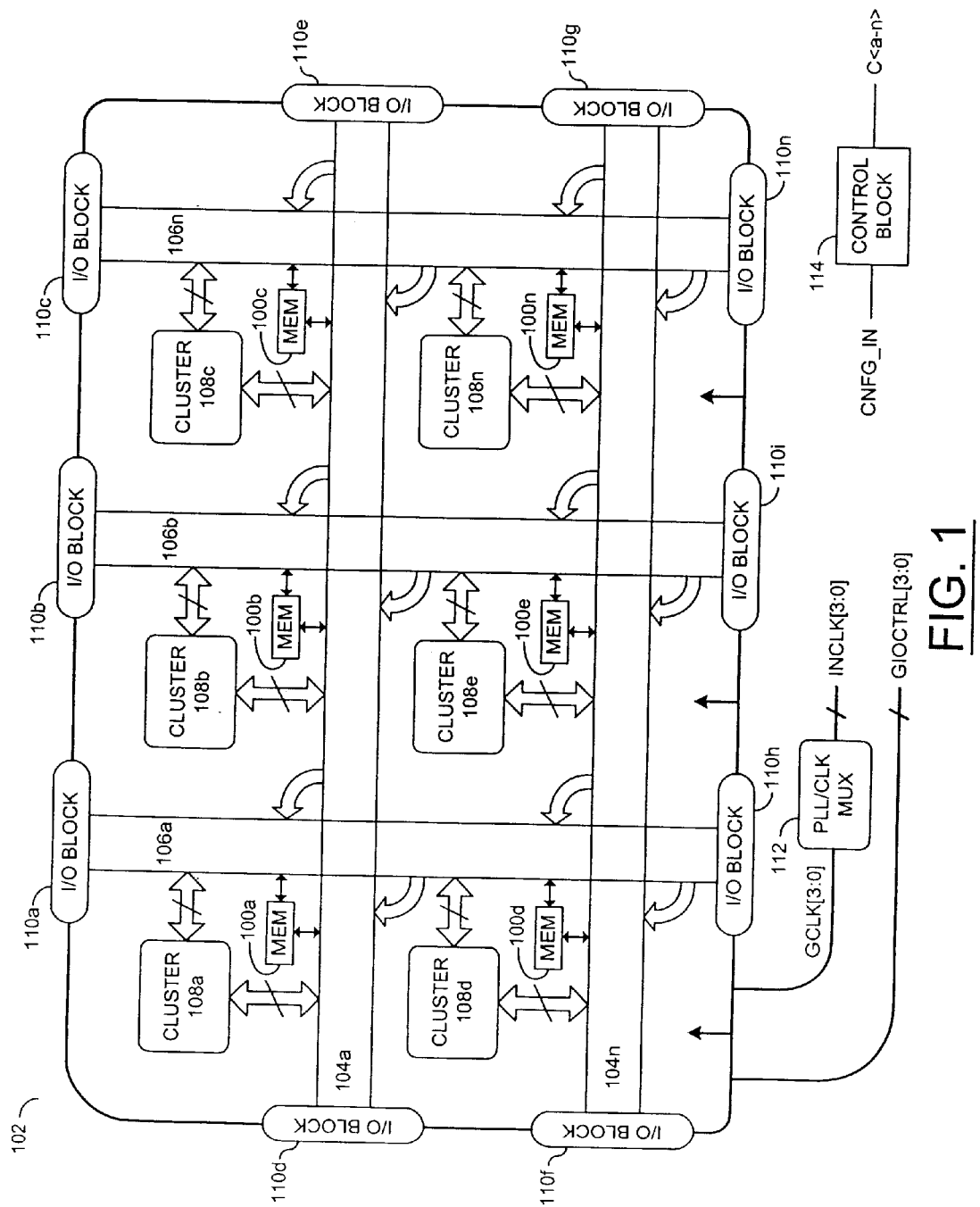
FIG. 1 is a block diagram of a PLD with a configurable memory in accordance with a preferred embodiment of the present invention.

Referring to FIG. 1, a block diagram of a configurable memory 100 is shown in accordance with a preferred embodiment of the present invention. The configurable memory 100 is shown implemented in the context of a programmable logic device (PLD) 102. The PLD 102 may comprises a number of the configurable memories 100a–100n, a number of horizontal routing channels 104a–104n, a number of vertical routing channels 106a–106n, a number of clusters 108a–108n, a number of I/O blocks 110a–110n, a phase lock loop multiplexer block 112 and a control block 114. The configurable memory 100 is generally connected to a horizontal routing channel 104 in the x-axis and a vertical routing channel 106 in the y-axis. The configurable memory 100 may be placed in the routing channels 104 and 106 to achieve higher performance with the I/O blocks 110.

The configurable memory 100 may be implemented, in one example, as a 4K-bit dual port array. However, other size arrays may be implemented accordingly to meet the design criteria of a particular application. In one example, the configurable memory 100 may be configured as a 4K×1, 2K×2, 1K×4, or 512×8 array. However, other configurations may be implemented accordingly with an array of a different size. Two or more configurable memories 100 may be cascaded using the routing channels 104 and 106 to form larger memory blocks. The configurable memory 100 may be used as either a synchronous memory or an asynchronous memory. The configurable memory 100 may be configured, in one example, as an asynchronous dual port memory, a synchronous dual port memory or a synchronous FIFO memory.

The configurable memory 100 may be configured to receive a clock signal (e.g., GCLK). The signal GCLK may be generated by the PLL multiplexer circuit 112 in response to an input clock signal (e.g., INCLK). The signal GCLK may comprise four clock signals. The memory 100 may be configured to receive a configuration signal Can. The signal Cain may be generated by the control block 114 in response to an input signal (e.g., CNFG__IN). The signals $C_{a-n}$ may be N-bits wide, where N is an integer. Each bit of the signal $C_{a-n}$ may be used as a control signal. The control block 114 may configure the PLD 102 to provide (i) support for a JTAG boundary scan, the JTAG programming standard STAPL, JTAG INTEST, and/or full scan and (ii) support for several configurations that may use compression/decompression to reduce storage requirements and error checking to detect problems.

The memory 100 may change configurations in response to the configuration signal $C_{a-n}$. The memory 100 may be configured using the JTAG programming standard STAPL.

The memory 100 may have the form of an asynchronous dual port RAM, a synchronous pipelined dual port RAM, a synchronous input RAM, a synchronous output RAM or a FIFO memory. However, other configurations of memory may be implemented to meet the design criteria of a particular application. The memory 100 may also configure the width of data stored in response to the signal $C_{a-n}$. The memory 100 may have a data width of ×1, ×2, ×4 or ×8. However, other widths of data may be implemented to meet the design criteria of a particular application. In one example, the memory 100 may be implemented as a 4K bit memory.

Figure 2:
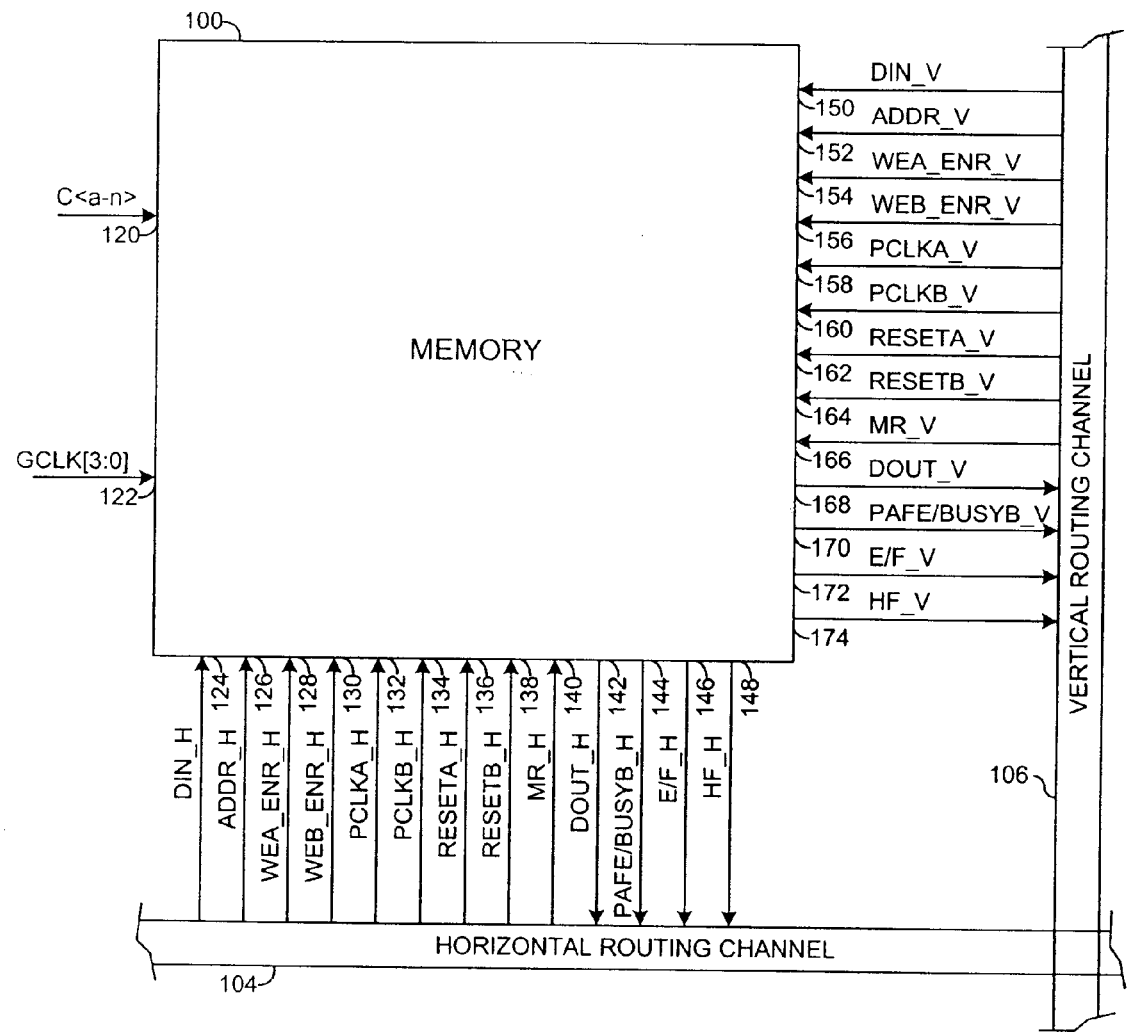
FIG. 2 is a detailed block diagram of a preferred embodiment of the configurable memory block.

Referring to FIG. 2, a more detailed block diagram of the memory circuit 100 illustrating a number of connections to the horizontal and vertical routing channels 104 and 106 is shown. The memory 100 may have an input 120 that may receive the signal $C_{a-n}$, an input 122 that may receive the signal GCLK[3:0]. The memory 100 may be configured to receive a number of signals from the horizontal routing channel 104. For example, the memory 100 may have an input 124 that may receive a data signal (e.g., DIN_H), an input 126 that may receive an address signal (e.g., ADDR_H), an input 128 that may receive an enable signal (e.g., WEA-ENR_H), an input 130 that may receive a enable signal (e.g., WEB-ENR_H), an input 132 that may receive a clock signal (e.g., PCLKA_H), an input 134 that may receive a clock signal (e.g., PCLKB_H), an input 136 that may receive a reset signal (e.g., RESETA_H), an input 138 that may receive a reset signal (e.g., RESETB_H) and an input 140 that may receive a master reset signal (e.g., MR_H).

The memory 100 may be configured to present a number of signals to the horizontal routing channel 104. For example, the memory 100 may have an output 192 that may present a data signal (e.g., DOUT_H), an output 144 that may present a memory status signal (e.g., PAFE/BUSYB_H), an output 146 that may present a memory status signal (e.g., E/F_H) and an output 148 that may present a memory status signal (e.g., HF_H).

The memory 100 may be configured to receive a number of signals from the vertical routing channel 106. For example, the memory 100 may have an input 150 that may receive a data signal (e.g., DIN_V), an input 152 that may receive an address signal (e.g., ADDR_V), an input 154 that may receive an enable signal (e.g., WEA-ENR_V), an input 156 that may receive an enable signal (e.g., WEB-ENR_V_), an input 158 that may receive a clock signal (e.g., PCLKA_V), an input 160 that may receive a clock signal (e.g., PCLKB_V), an input 162 that may receive a reset signal (e.g., RESETA_V), an input 164 that may receive a reset signal (e.g., RESETB_V) and an input 166 that may receive a reset signal (e.g., MR_V).

The memory 100 may present a number of signals to the vertical routing channel 106. For example, the memory 100 may have an output 168 that may present a data signal (e.g., DOUT_V), an output 170 that may present a memory status signal (e.g., PAFE-BUSYB_V), an output 172 that may present a memory status signal (e.g., E/F_V) and an output 174 that may present a memory status signal (e.g., HF_V).

Figure 3:
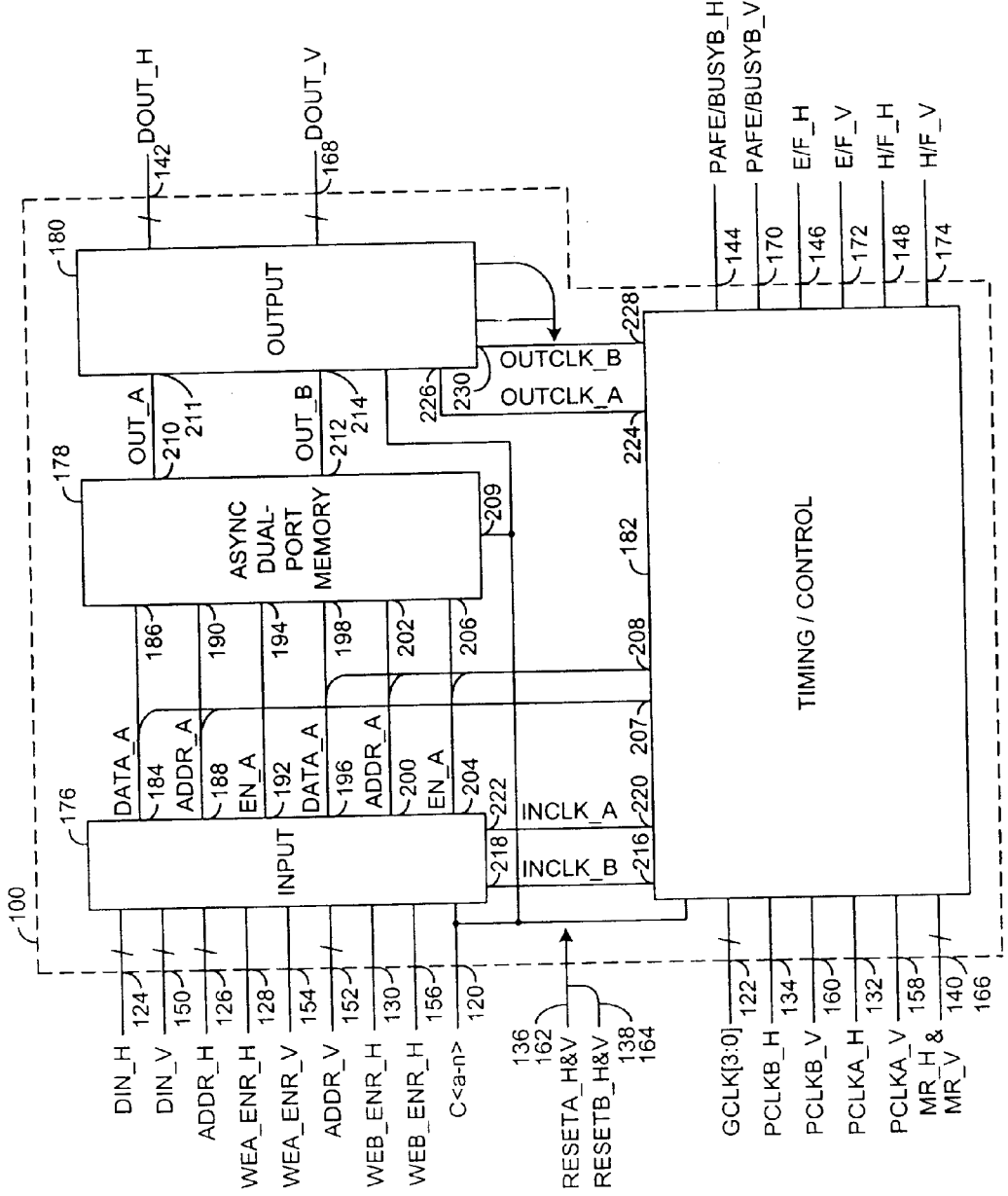
FIG. 3 is a more detailed block diagram of a preferred embodiment.

Referring to FIG. 3, a more detailed diagram of the memory 100 is shown. The memory 100 may comprise a circuit 176, a circuit 178, a circuit 180 and a circuit 182. The circuit 176 may be implemented, in one example, as an input multiplexer circuit. The circuit 178 may be implemented, in one example, as an asynchronous dual port memory circuit. The circuit 180 may be implemented, in one example, as an output multiplexer circuit. The circuit 182 may be implemented, in one example, as a timing and control circuit.

The circuit 176 may be configured to receive the signal DIN_H, the signal DIN_V, the signal ADDR_H, the signal WEA-ENR_H, the signal WEA-ENR_V, the signal ADDR_V, the signal WEB-ENR_H, the signal WEB-ENR_H, the signal $C_{a-n}$, a clock signal (e.g., INCLK_A) and a clock signal (e.g., INCLK_B). The circuit 176 may have an output 184 that may present a data signal (e.g., DATA_A) to an input 186 of the circuit 178, an output 188 that may present an address signal (e.g., ADDR_A) to an input 190 of the circuit 178, an output 192 that may present an enable signal (e.g., EN_A) to an input 194 of the circuit 178, an output 196 that may present a data signal (e.g., DATA_B) to an input 198 of the circuit 178, an output 200 that may present an address signal (e.g., ADDR_B) to an input 202 of the circuit 178 and an output 204 that may present an enable signal (e.g., EN_B) to an input 206 of the circuit 178. The signals DATA_A, ADDR_A, and EN_A may be presented to an input 207 of the circuit 182. The signals DATA_B, ADDR_B, and EN_B may be presented to an input 208 of the circuit 182. The signals DATA_A, ADDR_A, EN_A, DATA_B, ADDR_B and EN_B may be generated in response to one or more of the input signals DIN_H, DIN_V, ADDR_H, WEA_ENR_H, WEA_ENR_V, ADDR V, WEB-ENR-H, WEB_ENR_V, $C_{a-n}$, INCLK_A and INCLK_B.

The circuit 178 may have an input 209 that may receive the signal $C_{a-n}$, an output 210 that may present a data signal (e.g., OUT_A) to an input 211 of the circuit 180, and an output 212 that may present a data signal (e.g., OUT_B) to an input 214 of the circuit 180. The signals OUT_A and OUT B may be generated in response to one or more of the input signals DATA_A, ADDR_A, EN_A, DATA_B, ADDR_B, EN_B and $C_{a-n}$. The signal OUT_A may be generated in response to a different one or more of the signals DATA_A, ADDR_A, EN_A, DATA_B, ADDR_B, EN_B and $C_{a-n}$ than the signal OUT_B.

The circuit 180 may be configured to generate the signal DOUT_H and the signal DOUT_V in response to one or more of the signals OUT_A, OUT_B, $C_{a-n}$, OUTCLK_A, OUTCLK_B, RESETA_H, RESETA_V, RESETB_H and RESETBE_V.

The circuit 182 may be configured to receive the signals GCLK[3:0], PCLKA_H, PCLKA_V, PCLKB_H, PCLKB_V, MR_H and MR_V. The circuit 182 may be configured to generate the signals PAFE-BUSYB_H, PAFE-BUSYB_V, EF_H, EF_V, HF_H and HF_V as configurable memory status signals. The circuit 182 may have an output 216 that may present the signal INCLK_B to an input 218 of the circuit 176, an output 220 that may present the signal INCLK_A to an input 122 of the circuit 176, an output 224 that may present the signal OUTCLK_A to an input 226 of the circuit 180, and an output 228 that may present a clock signal OUTCLK_B to an input 230 of the circuit 180. The signals INCLK_B, INCLK_A, OUTCLK_A, OUTCLK_B may be generated in response to any one of the clock input signals GCLK[3:0], POLKA_H, PCLKA_V, PCLKB_H, PCLKB_V.

Figure 4:
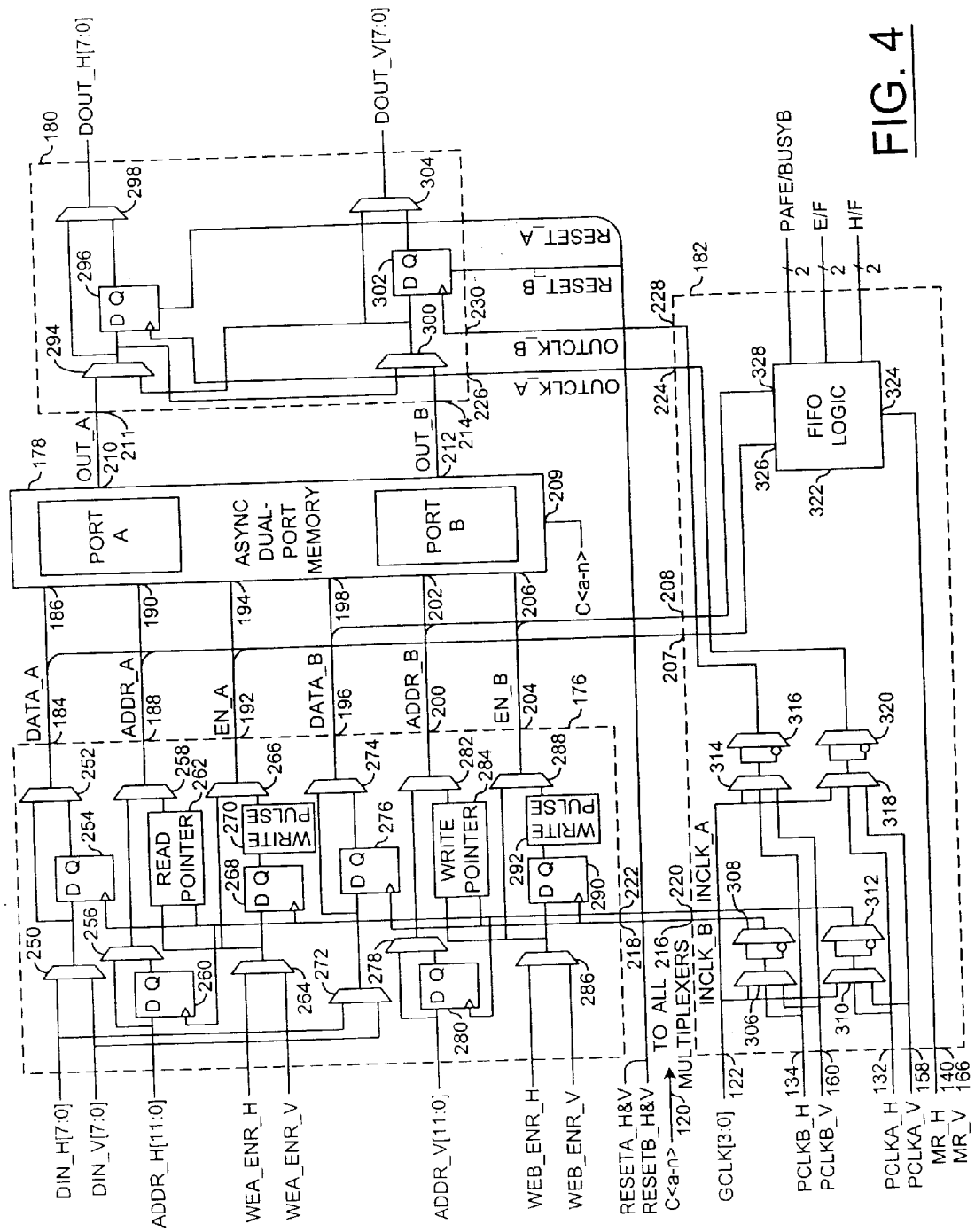
FIG. 4 is a circuit diagram of a preferred embodiment.

Referring to FIG. 4, a circuit diagram of the memory 100 (of FIG. 2) is shown. The circuit 176 may comprise, in one example, a multiplexer 250, a multiplexer 252,. a register 254, a multiplexer 256, a register 258, a multiplexer 260, a read point entry 262, a multiplexer 264, a multiplexer 266, a register 268, a write pulse generator 270, a multiplexer 272, a multiplexer 274, a register 276, a multiplexer 278, a multiplexer 280, a register 282, a write pointer 284, a multiplexer 286, a multiplexer 288, a register 290 and a write pulse generator 292.

The signal DIN_H may be presented to a first input of the multiplexer 250. The signal DIN_V may be presented to a second input of the multiplexer 250. An output of the multiplexer 250 may be connected to a first input of the multiplexer 252 and an input of the register 254. An output of the register 254 may be connected to a second input of the multiplexer 252. An output of the multiplexer 252 may present the signal DATA_A. A clock input of the register 254 may receive the signal INCLK_A.

The signal ADDR_H may be presented to an input of the register 260 and a first input of the multiplexer 256. An output of the register 260 may be presented to a second input of the multiplexer 256. An output of the multiplexer 256 may be presented to a first input of the multiplexer 258. The read pointer 262 may present a signal to a second input of the multiplexer 258. The multiplexer 258 may have an output that may present the signal ADDR_A. The register 260 may receive the signal INCLK_A at a clock input. The read pointer 262 may receive a signal INCLK_A at a clock input.

The signal WEA-ENR_H may be presented to a first input of the multiplexer 264. The signal WEA-ENR_V may be presented to a second input of the multiplexer 264. An output of the multiplexer 264 may be connected to (i) an input of the read pointer 262, (ii) a first input of the multiplexer 266 and (iii) an input of the register 268. The register 268 may have a clock input that may receive the signal INCLK_A. The register 268 may have an output that may present a signal to the write pulse generator 270. The write pulse generator may have an output that may present a signal to a second input of the multiplexer 266. The signal EN_A may be presented at an output of the multiplexer 266.

The signal DIN_H may be presented to a first input of the multiplexer 272. The signal in DIN_V may be presented to second input of the multiplexer 272. An output of the multiplexer 272 may be connected to a first input of the multiplexer 274 and an input of the register 276. The register 276 may have a clock input that may receive the signal INCLK_B. The register 276 may have an output that may present a signal to a second input on the multiplexer 274. The multiplexer 274 may have an output that may present the signal DATA_B.

The signal ADDR_V may be presented to an input of the register 280 and a first input of the multiplexer 278. The register 280 may have a clock input that may receive the signal INCLK_B and an output that may present a signal to a second input of the multiplexer 278. The multiplexer 278 may have an output that may present a signal to a first input of the multiplexer 282. The multiplexer 282 may have an output that may present the signal ADDR_B.

The signal WEB-ENR_H may be presented to a first input of a multiplexer 286. The signal WEB-ENR_V may be presented to a second input of a multiplexer 286. The multiplexer 286 may have an output that may present a signal to (i) an input of the write pointer 284, (ii) a first input of the multiplexer 288 and (iii) an input of the register 290. The write pointer 284 may have a clock input that may receive the signal INCLK_B and an output that may present a signal to a second input of the multiplexer 282. The register 290 may have a clock input that may receive the signal INCLK_B and an output that may present a signal to an input of the write pulse generator 292. The write pulse generator 292 may have an output that presents a signal to a second input of the multiplexer 288. The multiplexer 288 may have an output that may present the signal EN_B.

The circuit 180 may comprise a multiplexer 294, a register 296, a multiplexer 298, a multiplexer 300, a register 302 and a multiplexer 304. The signal OUT_A may be presented to a first input of the multiplexer 294. An output of the multiplexer 294 may present a signal to (i) an input of the register 296, (ii) a first input of the multiplexer 298, and (iii) a first input of the multiplexer 300. The register 296 may have (i) a clock input that may receive the signal OUTCLK_A, (ii) a reset input that may receive the signal RESETA, and (iii) an output that may present a signal to a second input of the multiplexer 298. The multiplexer 298 may have an output that may present the signal DOUT_H. The signal OUT_B may be presented to a second input of the multiplexer 300. The multiplexer 300 may have an output that may present a signal to (i) a second input of the multiplexer 294, (ii) an input of the register 302 and (iii) a first input of the multiplexer 304. The register 302 may have (i) a clock input that may receive the signal OUTCLK_B, (ii) a reset input that may receive the signal RESETB and (iii) an output that may present a signal to a second input of the multiplexer 304. The multiplexer 304 may present the signal DOUT_V.

The circuit 182 may comprise a multiplexer 306, a multiplexer 308, a multiplexer 310, a multiplexer 312, a multiplexer 314, a multiplexer 316, a multiplexer 318, a multiplexer 320 and a FIFO logic block 322. The signal GCLK[3:0] may be presented to a first input of the multiplexer 306, a first input of the multiplexer 310, a first input of the multiplexer 314, and a first input of the multiplexer 318. The signal PCLKB_H may be presented to a second input of the multiplexer 306 and a second input of the multiplexer 314. The clock signal PCLKB_V may be presented to a third input of the multiplexer 306 and a third input of the multiplexer 314. The clock signal PCLKA_H may be presented to a second input of the multiplexer 310 and a second input of the multiplexer 318. The clock signal PCLKA_V may be presented to a third input of the multiplexer 310 and a third input of the multiplexer 318. The multiplexer 306 may have an output that may present a signal to a non-inverting input and an inverting input of the multiplexer 308. The multiplexer 308 may have an output that may present the signal INCLK_B. The multiplexer 310 may have an output that may present the signal to a non-inverting input and an inverting input of the multiplexer 312. The multiplexer 312 may have an output that may present the signal INCLK_A. The multiplexer 314 may have an output that may present a signal to an inverting input and a non-inverting input of the multiplexer 316. The multiplexer 316 may have an output that may present the signal OUTCLK_B. The multiplexer 318 may have an output that may present a signal to a non-inverting input and an inverting input of the multiplexer 320. The multiplexer 320 may have an output that may present the signal OUTCLK_A.

The FIFO logic block 322 may have (i) an input 324 that may receive the signals MR_V and MR_V, (ii) an input 326 that may receive the signals DATA_A, ADDR_A, EN_A, and (iii) an input 328 that may receive the signal DATA_B, ADDR_B, and EN_B. The FIFO logic block 322 may be configured to generate (i) the signal PAFE/BUSYB in response to the memory 178 being almost full or almost empty, (ii) the signal E/F in response to the memory 178 being empty or full, and (iii) the signal HF in response to the memory 178 being half full. The signal PAFE/BUSYB may be programmed to indicate either the almost full condition or the almost empty condition. The signals PAFE/BUSYB, E/F, and HF may be used as FIFO status flags.

The signal $C_{a-n}$ may be presented to (i) a control input of each of the multiplexers described in connection with FIG. 4 and (ii) the input 209 of the circuit 178. The circuit 178 may select a memory width in response to the signal $C_{a-n}$.

Figure 5:
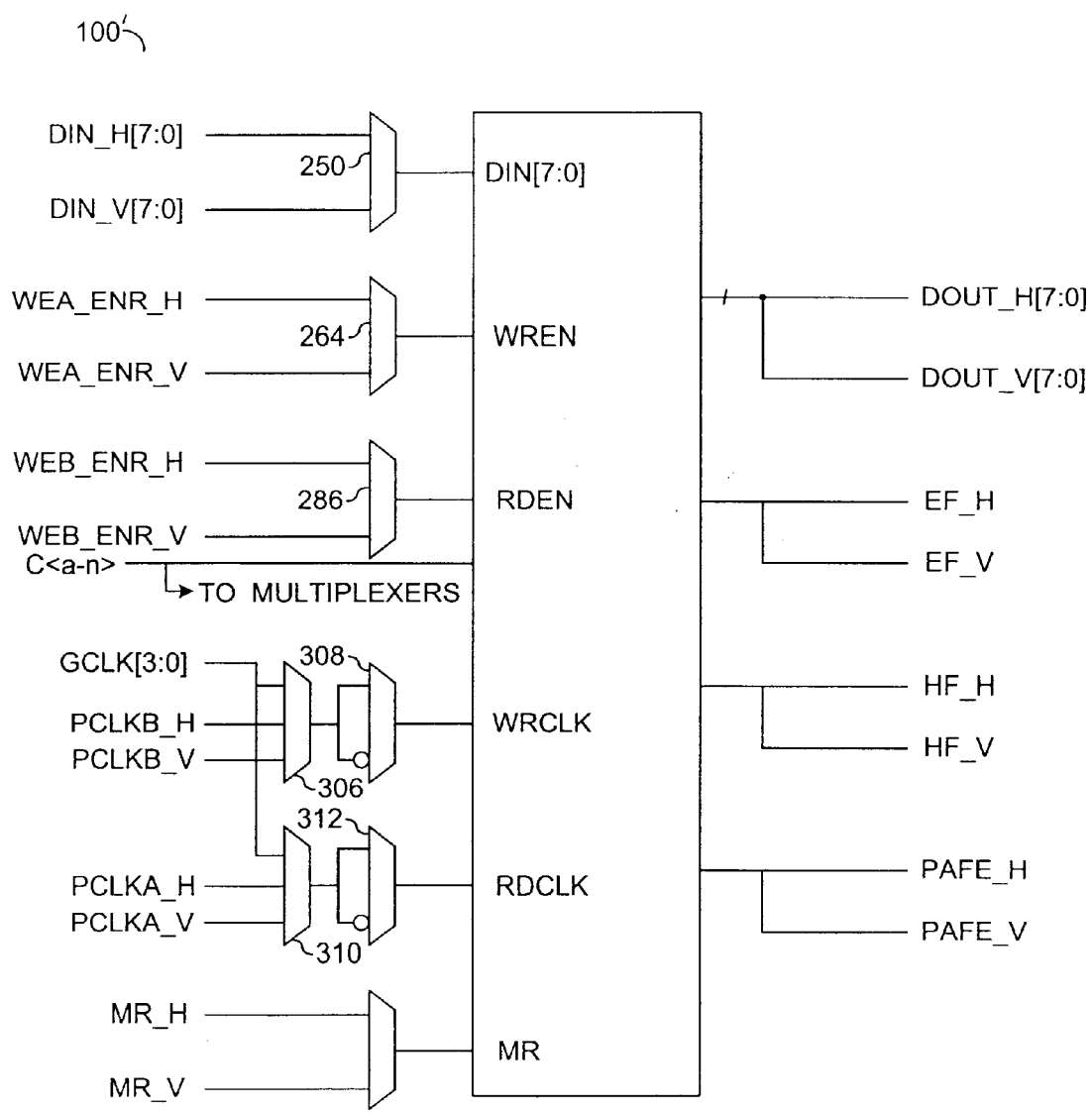
FIG. 5 is a block diagram illustrating a possible configuration of the memory of FIG. 3.

Referring to FIG. 5, a diagram of the memory 100 illustrating a FIFO configuration is shown. When used in the FIFO configuration, the width of the FIFO may be expanded using two or more memories 100. However, the depth of the FIFO will generally be limited to the size of a single memory 100. For example, a 4K-bit memory 100 will generally yield a FIFO with a maximum depth of 4K bits. The FIFO implemented with one or more memories 100 may be configured to receive data and write enables from either the horizontal routing channel 106 or the vertical routing channel 108. The FIFO may have independent read and write clocks. Clock signals for read, write, and synchronous activities may be chosen from the 4 global clocks GCLK [3:0] or from the four logic clocks PCLKA_H, PCLKB_H, PCLKA_V, and PCLKB_V from the channels 106 and 108. The polarity of the clocks may also be selected. The FIFO configuration of the memory 100 may present output and flag signals to both horizontal and vertical routing channels.

Figure 6:
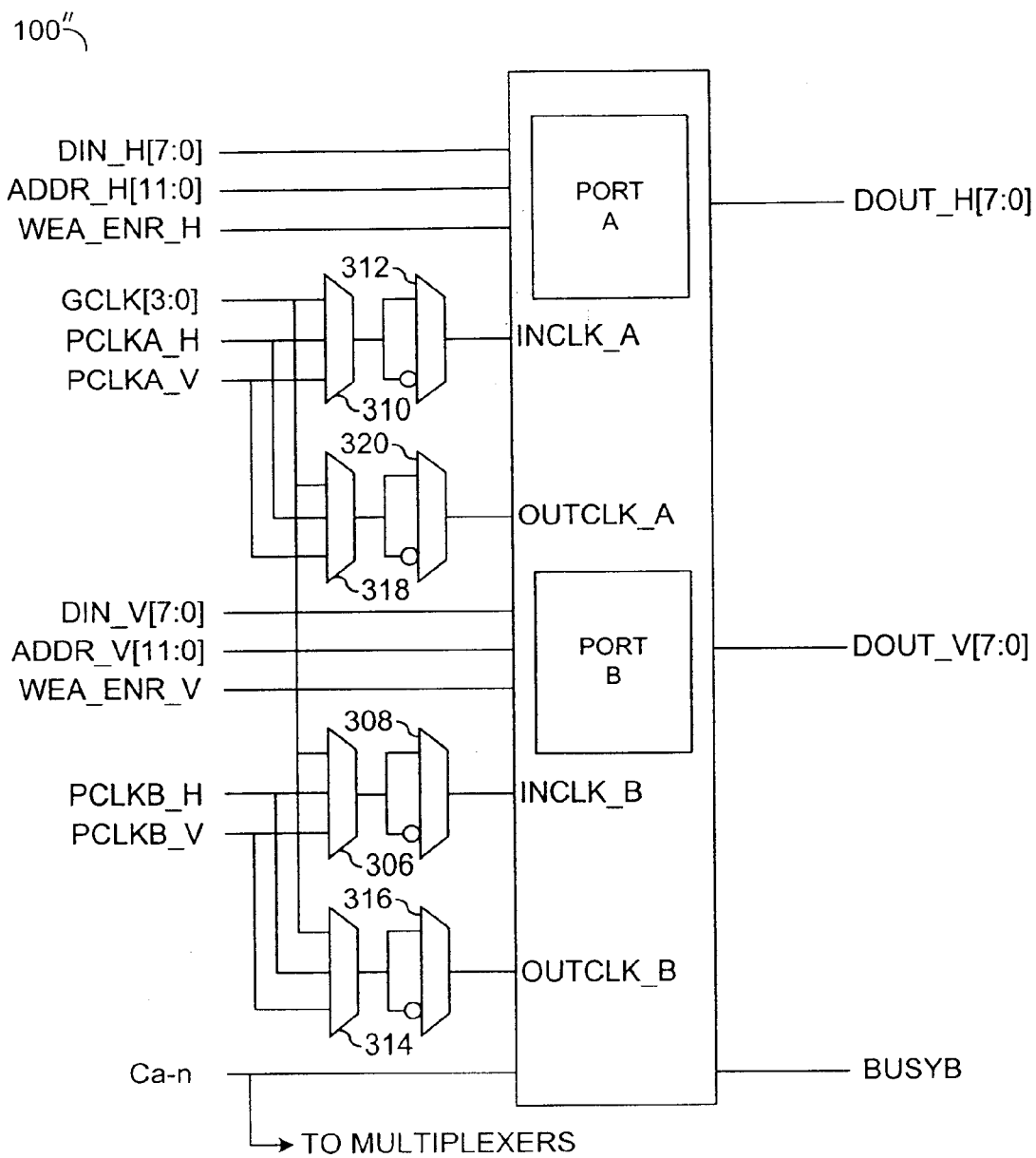
FIG. 6 is a block diagram illustrating another possible configuration of the memory of FIG. 3.

Referring to FIG. 6, a diagram of the memory 100 illustrating a dual port configuration is shown. In the dual port configuration of the memory 100, synchronous or asynchronous ports may be chosen. However, both ports will generally have to be synchronous or asynchronous. Each port may have a separate data, address, and control input and/or output. The ports will generally be arbitrated so that port A will generally win all conflicts. The dual port memory configuration may have an expandable width and depth by cascading multiple memories 100. Clock signals for read, write, and synchronous activities may be chosen from the 4 global clocks GCLK[3:0] or from the four logic clocks PCLKA_H, PCLKB_H, PCLKA_V, and PCLKB_V from the channels 106 and 108. The polarity of the clocks may also be selected. The signal PAFE/BUSYB may be used as a dual port status signal.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory device configured to:
      receive one or more inputs from a first bus and a second bus;
      present one or more outputs to said first bus and said second bus; and
      operate in one or more modes in response to one or more control signals; and
   a programmable logic circuit configured to generate said control signals.

2. The apparatus according to claim 1, wherein said apparatus comprises a configurable memory in a programmable logic device.

3. The apparatus according to claim 2, wherein said first bus comprises a first routing channel of said programmable logic device.

4. The apparatus according to claim 2, wherein said second bus comprises a second routing channel of said programmable logic device.

5. The apparatus according to claim 2, wherein:
   said programmable logic device comprises a first routing channel run parallel to a first axis and a second routing channel run parallel to a second axis; and
   said memory device is connected to said first routing channel and to said second routing channel.

6. The apparatus according to claim 1, wherein said memory device further comprises an asynchronous dual port RAM.

7. The apparatus according to claim 6, wherein said memory device further comprises an input multiplexer configured to select input signals to said asynchronous dual port RAM in response to said control signals.

8. The apparatus according to claim 6, wherein said memory device further comprises an output multiplexer configured to select output signals in response to said control signals.

9. The apparatus according to claim 1, wherein a plurality of said memory devices are cascaded to form a larger memory block.

10. The apparatus according to claim 1, wherein said memory device is configurable as a synchronous FIFO memory.

11. The apparatus according to claim 1, wherein said memory device is configurable as a synchronous dual port memory.

12. The apparatus according to claim 1, wherein said memory device is configurable as an asynchronous dual port memory.

13. The apparatus according to claim 1, wherein said memory device is configured using a JTAG programming standard STAPL.

14. The apparatus according to claim 1, wherein said memory device comprises dedicated FIFO logic.

15. The apparatus according to claim 1, wherein said memory device comprises dedicated dual port logic.

16. The apparatus according to claim 1, wherein said memory device is configurable to connect directly to one or more inputs or outputs through said first and/or said second busses.

17. An apparatus comprising:
   means for configuring a memory device to:
      receive one or more inputs from a first bus and a second bus;
      present one or more outputs to said first bus and said second bus; and
      operate in one or more modes in response to one or more control signals; and
   means for programmably generating said control signals.

18. A method of laying out a programmable logic device comprising the steps of:
   placing a first routing channel parallel to a first axis;
   placing a second routing channel parallel to a second axis; and
   connecting one or more inputs and one or more outputs of a memory device, configured to operate in one or more modes in response to one or more control signals generated by said programmable logic device, to said first and said second routing channels.

* * * * *